(12) United States Patent  
Ignatiev

(10) Patent No.: US 12,662,727 B2  
(45) Date of Patent: Jun. 23, 2026

(54) METHOD AND SYSTEM FOR VACUUM VAPOR DEPOSITION OF FUNCTIONAL MATERIALS IN SPACE

(71) Applicant: Lunar Resources, Inc., Houston, TX (US)

(72) Inventor: Alex Ignatiev, Houston, TX (US)

(73) Assignee: Lunar Resources, Inc., Houston, TX (US)

( * ) Notice: Subject to any disclaimer, the term of this patent is extended or adjusted under 35 U.S.C. 154(b) by 137 days.

(21) Appl. No.: 18/300,209

(22) Filed: Apr. 13, 2023

(65) Prior Publication Data

US 2023/0250529 A1 Aug. 10, 2023

Related U.S. Application Data

(63) Continuation of application No. 17/601,156, filed as application No. PCT/US2020/026899 on Apr. 6, 2020.

(Continued)

(51) Int. Cl.  
*B64G 4/00* (2006.01)  
*C23C 14/04* (2006.01)  
(Continued)

(52) U.S. Cl.  
CPC ................ *C23C 14/04* (2013.01); *B64G 4/00* (2013.01); *C23C 14/24* (2013.01); *C23C 14/50* (2013.01);  
(Continued)

(58) Field of Classification Search  
CPC ............ C23C 14/24; C23C 14/34; B64G 4/00  
See application file for complete search history.

(56) References Cited

U.S. PATENT DOCUMENTS

| | | |
|---|---|---|
| 3,963,897 A | 6/1976 | Wakita et al. |
| 4,480,677 A | 11/1984 | Henson et al. |
| | (Continued) | |

FOREIGN PATENT DOCUMENTS

| | | |
|---|---|---|
| EP | 3587615 A1 | 1/2020 |
| JP | H0841632 A | 2/1996 |
| | (Continued) | |

OTHER PUBLICATIONS

Translation to Manivannan (JP 2006-319335) published Nov. 2006 (Year: 2006).*

(Continued)

*Primary Examiner* — John J Brayton  
(74) *Attorney, Agent, or Firm* — C.Tumey Law Group PLLC

(57) ABSTRACT

Methods and systems for depositing a deposition material on a substrate in a space environment may include a substrate support structure on a surface of a planetary body in the space environment, a depositor for the deposition material, an energy source associated with the depositor to excite the deposition material to form a vapor of the deposition, and a moveable elongate member associated with the depositor, to move the depositor over the substrate, whereby the vapor of deposition material from the depositor may pass over the substrate and flow to the substrate to coat the substrate with the deposition material.

43 Claims, 8 Drawing Sheets

Related U.S. Application Data

(60) Provisional application No. 62/829,464, filed on Apr. 4, 2019.

(51) Int. Cl.

| | |
|---|---|
| *C23C 14/24* | (2006.01) |
| *C23C 14/50* | (2006.01) |
| *C23C 14/54* | (2006.01) |
| *C23C 14/56* | (2006.01) |
| *C23C 16/455* | (2006.01) |
| *H10K 71/16* | (2023.01) |
| *H10K 71/40* | (2023.01) |

(52) U.S. Cl.
CPC .............. *C23C 14/54* (2013.01); *C23C 14/56* (2013.01); *C23C 16/45563* (2013.01); *B64G 2004/005* (2013.01); *H10K 71/164* (2023.02); *H10K 71/40* (2023.02)

(56) References Cited

U.S. PATENT DOCUMENTS

| | | | | |
|---|---|---|---|---|
| 4,543,275 A | | 9/1985 | Akashi et al. | |
| 4,543,276 A | | 9/1985 | Parekh | |
| 4,710,346 A | | 12/1987 | Rossman | |
| 4,723,734 A | * | 2/1988 | Naumann | B64G 1/66 134/2 |
| 4,724,299 A | | 2/1988 | Hammeke | |
| 5,140,939 A | | 8/1992 | Valentian | |
| 5,454,847 A | | 10/1995 | Jacoboni et al. | |
| 5,482,003 A | | 1/1996 | McKee et al. | |
| 5,779,002 A | | 7/1998 | Paton et al. | |
| 5,869,801 A | * | 2/1999 | Paton | H01J 37/24 219/121.13 |
| 6,378,809 B1 | | 4/2002 | Pon | |
| 7,163,179 B1 | | 1/2007 | Taylor | |
| 10,052,820 B2 | | 8/2018 | Kemmer et al. | |
| 2003/0059526 A1 | | 3/2003 | Benson et al. | |
| 2004/0118349 A1 | | 6/2004 | Endle et al. | |
| 2005/0005848 A1 | | 1/2005 | Yamazaki et al. | |
| 2005/0022743 A1 | | 2/2005 | Sakata et al. | |
| 2005/0066897 A1 | * | 3/2005 | Pelhos | C23C 14/044 118/721 |
| 2006/0177891 A1 | | 8/2006 | Kishen et al. | |
| 2007/0125910 A1 | | 6/2007 | Cepollina et al. | |
| 2008/0047607 A1 | | 2/2008 | Horsky et al. | |
| 2009/0302503 A1 | | 12/2009 | Ruuttu et al. | |
| 2011/0260007 A1 | | 10/2011 | Adachi | |
| 2011/0262650 A1 | | 10/2011 | Lee | |
| 2012/0009706 A1 | | 1/2012 | Choi et al. | |
| 2014/0234551 A1 | | 8/2014 | Sparkes et al. | |
| 2014/0316546 A1 | * | 10/2014 | Walsh | G06Q 20/40 700/98 |
| 2015/0284838 A1 | | 10/2015 | Marx et al. | |
| 2016/0005897 A1 | | 1/2016 | Honda et al. | |
| 2016/0260261 A1 | * | 9/2016 | Hsu | B23K 9/32 |
| 2018/0217304 A1 | | 8/2018 | Sheikh | |
| 2019/0031552 A1 | | 1/2019 | Clawson et al. | |
| 2019/0152835 A1 | | 5/2019 | Volfson et al. | |
| 2021/0363642 A1 | | 11/2021 | Flowers et al. | |
| 2022/0195589 A1 | | 6/2022 | Ignatiev | |

FOREIGN PATENT DOCUMENTS

| | | | | | |
|---|---|---|---|---|---|
| JP | 2006319335 A | * | 11/2006 | .......... | H10F 77/315 |
| KR | 20040093011 A | * | 11/2004 | | |
| WO | 2020/206435 | | 10/2020 | | |

OTHER PUBLICATIONS

European Patent Office; Partial Supplementary European Search Report, issued in connection to application No. EP20784714.6; 15 pages; Apr. 18, 2023; Europe.

European Patent Office; Partial Supplementary European Search Report, issued in connection to application No. EP20784714.6; 14 pages; Dec. 5, 2022; Europe.

Bunner, Alan N.; Optical coatings in space; Engineering Report No. ER-591; Perkin-Elmer Optical Group; pp. 1-183; Oct. 27, 1983; https://ntrs.nasa.gov/api/citations/19840013222/downloads/19840013222.pdf.

Sheikh, David A. et al.; Battery-powered thin film deposition process for coating telescope mirrors in space; Proceedings of Spie; vol. 9904; 6 pages; Jul. 29, 2016.

Suita, Y. et al.; Study of gas tungsten arc welding in space; Welding International; vol. 8; No. 4; XP000435605; pp. 269-273; Jan. 1, 1994.

Agapakis, John E. et al.; Remotely manipulated and autonomous robotic welding fabrication in space; Proceedings of the Spie; vol. 0580; pp. 68-77; Dec. 23, 1985.

Intellectual Property India; Examination Report, issued in connection to application No. 202137050525; 6 pages; Apr. 20, 2023; India.

United States Patent and Trademark Office, Mail Stop PCT; PCT International Search Report, issued in connection to application No. PCT/US2020/026899; Jul. 2, 2020.

United States Patent and Trademark Office, Mail Stop PCT; PCT Written Opinion of the International Searching Authority, issued in connection to application No. PCT/US2020/026899; Jul. 2, 2020.

The International Bureau of WIPO; PCT International Preliminary Report on Patentability, issued in connection to application No. PCT/US2020/026899; Sep. 28, 2021.

Werner, Debra. "FOMS reports high-quality ZBLAN production on ISS." SpaceNews Online Magazine, Nov. 7, 2019. PDF file. 3 pages.

Office Action Summary for U.S. Appl. No. 17/601,156 dated Feb. 22, 2024. PDF file. 13 pages.

Office Action Summary for U.S. Appl. No. 17/601,156 dated Oct. 17, 2023. PDF file. 11 pages.

Non-Final Office Action Summary for U.S. Appl. No. 17/601,156 dated Jul. 9, 2025. 16 pages.

Japanese Office Action for JP Patent Application No. 2021-560440 dated Jan. 29, 2025. English Translation with Original Untranslated Version, PDF file. 10 pages.

\* cited by examiner

METHOD AND SYSTEM FOR VACUUM VAPOR DEPOSITION OF FUNCTIONAL MATERIALS IN SPACE

RELATED APPLICATIONS

This application is a continuation of U.S. patent application Ser. No. 17/601,156 filed Oct. 4, 2021, which is a 371 national stage entry of PCT/US2020/026899, filed Apr. 6, 2020, which claims priority from U.S. Provisional Patent Application No. 62,829,464, filed Apr. 4, 2019, the disclosures and contents of which are incorporated by reference herein in its entirety.

BACKGROUND OF THE INVENTION

Field of the Disclosure

This disclosure relates generally to the field of vacuum vapor deposition of functional materials onto a substrate in a space environment.

Description of the Related Art

The NASA-sponsored Wake Shield Facility (WSF) program was a free-flying fabrication facility on a disc-shaped spacecraft, deployed from the Space Shuttle in low earth orbit ("LEO") for the growth of epitaxial semiconductor thin films in the vacuum of space. The forward edge of the WSF disk redirected LEO residual atmospheric and other particles around its sides, leaving an "ultra-vacuum" in its wake. The first-ever crystalline semiconductor thin films were grown in this vacuum wake region of space. These included gallium arsenide (GaAs) and aluminum gallium arsenide (AlGaAs) depositions.

BRIEF SUMMARY

The following presents a simplified summary of the disclosed subject matter in order to provide a basic understanding of some aspects of the subject matter disclosed herein. This summary is not an exhaustive overview of the technology disclosed herein. It is not intended to identify key or critical elements of the invention or to delineate the scope of the invention. Its sole purpose is to present some concepts in a simplified form as a prelude to the more detailed description that is discussed later.

In one exemplary embodiment, the system for vacuum vapor deposition of a deposition material upon a substrate in a space environment may comprise; a substrate support structure associated with a space platform in the space environment; a depositor for the deposition material; an energy source associated with the depositor to excite the deposition material to form a vapor of the deposition material; and a moveable elongate member, associated with the depositor, to move the depositor over the substrate, whereby the vapor of the deposition material from the depositor may pass over the substrate and flow to the substrate to coat the substrate with the deposition material.

In another exemplary embodiment, a method for vacuum vapor deposition of a deposition material upon a substrate in a space environment to form a functional material on the substrate, may comprise; disposing a substrate on a substrate support structure associated with a space platform in the space environment; providing a depositor for the deposition material; providing an energy source associated with depositor and exciting the deposition material to form a vapor of the deposition material; providing a moveable elongate member, associated with the depositor; and moving the depositor and the elongate member to pass over the substrate to direct the vapor of the deposition material to flow to the substrate to form a functional material on the substrate.

BRIEF DESCRIPTION OF THE DRAWING

The present method and system for vacuum vapor deposition of functional materials in space may be understood by reference to the following description taken in conjunction with the accompanying drawing, in which.

Figure 1:
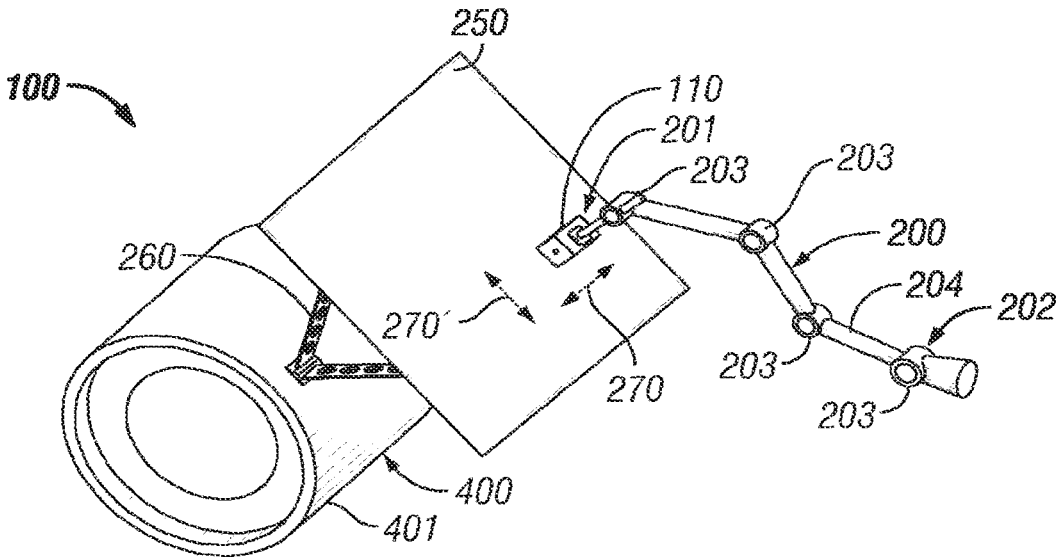
FIG. 1 is a perspective view of a system for vacuum vapor deposition of a deposition material upon a substrate in a space environment in accordance with an illustrative embodiment of the invention.

While certain embodiments of the present method and system for vacuum vapor deposition of functional materials in space will be described in connection with the present exemplary embodiments shown herein, it will be understood that it is not intended to limit the invention to those embodiments. On the contrary, it is intended to cover all alternatives, modifications, and equivalents, as may be included within the spirit and scope of the invention as defined by the appended claims. In the drawing figures, which are not to scale, the same reference numerals are used throughout the description and in the drawing figures for components and elements having the same structure, and primed reference numerals are used for components and elements having a similar function and construction to those components and elements having the same unprimed reference numerals.

DETAILED DESCRIPTION OF THE EXEMPLARY EMBODIMENTS

It should be understood that, although an illustrative implementation of one or more exemplary embodiments are provided below, the various specific exemplary embodiments may be implemented using any number of techniques known by persons of ordinary skill in the art. The disclosure should in no way be limited to the exemplary embodiments, drawings, and/or techniques illustrated below, including the exemplary designs and implementations illustrated and described herein. Furthermore, the disclosure may be modified within the scope of the appended claims along with their full scope of equivalents.

Future space-based earth observation, communications, astrophysics and other space missions are demanding higher performance functional payloads and sensors as more of the world's telecommunication infrastructure and reliance on earth surveillance is provided by space-based assets. This will result in the need to produce continually larger antennas, radars, reflectors, and photovoltaic power systems for in-space assets with an emphasis on affordability and system resilience. To date, space hardware has been designed around the limitation of a launch vehicle's payload capacity, reducing its capability to provide larger antennas, reflectors, radars, and photovoltaic power systems. If these size-critical hardware components were to be manufactured in space, the natural vacuum of space could be used to perform vacuum vapor deposition to construct these hardware components and systems on-orbit. These components and systems will be capable of in-space repair and expansion enabling response to changing requirements and demands. It is believed that the production of ultra-large antennas, reflectors, radars, reflective surfaces, and photovoltaic power systems on-orbit may be achieved with effectively unlimited aperture sizes and extremely low areal densities for space-based assets.

Vacuum vapor deposition is a terrestrial manufacturing process used to fabricate functional coatings—reflective, emissive, absorptive, etc.—to produce a variety of products including crystalline thin film devices such as solar cells and transistors. This process is proposed to be used in the space environment which includes in: free space; a low earth orbit ("LEO"); a sun-synchronous orbit ("SSO"); a medium earth orbit ("MEO"); a geostationary, or geosynchronous, orbit ("GEO"); other earth orbits; and cis-lunar space, as well as on the surface of the moon, or other planetary bodies having reduced atmospheres, such as other moons, asteroids, and other planets, e.g., Mercury, Mars, etc.

A vacuum vapor deposition process may take advantage of the natural vacuum in a space environment to deposit atomically layered materials in the fabrication of a wide variety of functional coatings, thin film materials, and thick film materials for fabrication of functional hardware such as phased array antennas, antenna reflectors, synthetic aperture radar antennas, radar, other reflectors, photovoltaic cells, and power transmission wires in-space with ultra-large dimensions and quality which can be integrated with space assets to perform a variety of space missions.

Considering space-based deployable technology manufactured terrestrially is reaching its practical limits with the advent of the James Webb Space Telescope's deployable 6.5 m (21.4 ft) segmented primary mirror system, it is proposed to manufacture extremely large components in the space environment with the present method and system. Manufacturing antennas, reflectors, and photovoltaic power systems in the vacuum of space could provide the opportunity to utilize nearly unlimited aperture sizes with extremely low areal densities for space-based assets providing vast new capabilities for space users.

It is believed that the present method and system for vacuum vapor deposition of functional coatings, thin film and thick film materials will enable the fabrication of functional materials in space and can be applied to the manufacture of ultra-large objects—greater than 50 meters in diameter—and components of spacecraft, satellites, and other space assets. The present method and system provides direct applications to space-based assets including: in-space fabrication of phased array/antennas, antenna reflectors, reflecting antennas, synthetic aperture radar, radar reflectors, mirrors, photovoltaic cells, transmission cables and wiring; fabrication of interconnected dipole antennas, and reflective surfaces for mirrors; fabrication of antenna reflectors to be applied to remote sensing, astrophysical and communication missions; and in-space servicing of assets to repair functional coatings, restore functional materials, and upgrade space-assets on orbit. Fabricating these components in space has significant advantages over Earth manufactured space systems, as mission planners are able to: a) increase performance, robustness, and stability of space assets; b) eliminate the design limitations of launch (size, volume, durability) of Earth manufactured antennas; c) develop new designs with a greater variety of materials; d) continually scale, upgrade and restore space manufactured components; and e) enable a more efficient supply chain architecture to manufacture and operate components from space.

The present method and system can fabricate, repair, restore, and upgrade space assets, including coatings, and thin film and thick film materials on space assets. The present method and system also has the ability to fabricate or recoat emissive, absorptive, reflective coatings, and other functional materials, fabricate and restore photovoltaic ("PV") power systems and other functional materials, and continually upgrade space assets.

Due to the flexible nature of vacuum vapor deposition in the space vacuum environment, the substrates for functional coatings can be fabricated in-space utilizing additive manufacturing, or can be Earth manufactured, launched and robotically assembled or deployed on orbit for use in the space vacuum vapor deposition process. The vacuum vapor deposition process involves depositing element vapors over an area, one atomic layer at a time. Vacuum vapor deposition builds functional materials by atomically layering specific elements into unique configurations, thus fabricating advanced thin-film functional materials. As an example, the manufacture of large antennas and reflective surfaces may be made by depositing the following materials to fabricate reflective surface coatings and antennas: Ag, Al, Au, Be, Ca, Mg and Ti, among others.

The present method and system may be used to fabricate antennas, reflectors, radars, photovoltaic power systems, other functional materials, and other absorptive, reflective and emissive coatings in-space by directly depositing materials on a substrate in the vacuum of space Functional materials may be deposited in space's vacuum onto a substrate using vacuum vapor deposition to create antennas, reflectors, radars, photovoltaic power systems, and other functional materials. The deposition process may be thermal evaporation, ion-beam evaporation/sputtering, electron beam evaporation, laser deposition or other more complex physical deposition techniques. The deposition process may also be chemical deposition, including chemical vapor deposition, metal/organic chemical vapor deposition, metal-organic deposition, or other chemical vapor deposition processes. While the fabrication process of an antenna and reflective surface are similar, different deposition approaches may be used to optimize the fabrication process.

As an example, the in-space fabrication of thin-film microwave antennas and radar antennas involves producing interconnected antenna elements, directly deposited on a substrate to form a large area antenna array via thin metallic film deposition. These antennas are able to accommodate required spacing from 1 mm to greater than 10 meters based upon the application requirements. The present method and system can fabricate such antenna arrays and interconnected power wires in-space with a variety of metallic materials including: Ag, Al, Ca, Cu, Mg, and alloys depending on specifically required conductive properties. As a further example, the in-space fabrication of a reflective surface, such as a mirror, involves a thin metallic coating deposited onto a substrate using thin film deposition. Mirror coatings typically involve a gold, aluminum, silver, or other reflective coating with a thickness of from a few nanometers to over 1000 nm. The present method and system deposit reflective coatings with a variety of materials including: Ag, Al, Au, Be, Mg, Ti and alloys depending on specifically required optical properties. In addition, these coatings are able to be layered with different elements to fabricate a variety of different surfaces for space assets.

The present method and system for the fabrication of antennas, radars, reflectors, and photovoltaic power systems may use an in-space elongate member or arm, which may be a robotic member or arm system associated with a satellite, a spacecraft bus, other space vehicle, space station, or other space platform to assemble, or fabricate, the substrate, and to manipulate, or move, the vacuum vapor deposition system over the substrate, or manipulate, or move, the substrate over the vacuum vapor deposition system so as to coat a substrate. The substrate and vacuum vapor deposition fabrication systems are designed to be integrated with, and maneuvered by, the elongate member, or robotic arm system, which also provides these systems their required power and equipment. The length of the elongate member or robotic arm system determines the maximum dimensions an object can be manufactured and the power availability for the arm and the vacuum vapor deposition system from an energy source for the system determines the rate of deposition in the vacuum vapor deposition process.

In addition to robotic arms, or elongate members or arms, a robotic grapple may be used to maneuver the manufactured object while being fabricated. Both the robotic arm and grapple may include autonomous or telerobotic robotic software to control the fabrication process.

With reference to FIG. 1, a system 100 for vacuum vapor deposition of a coating, thin film or thick film material upon a substrate in a space environment in accordance with an illustrative embodiment is shown. The deposition system 100 generally includes: a substrate 250; a substrate support structure 260, associated with a space platform 400; a vacuum vapor depositor, or depositor, 110 for the deposition material; and a moveable elongate member, or arm, 200, associated with the depositor, 110. The system 100 may be used in a space environment, including as previously described in free space, LEO, SSO, GEO, in other Earth orbits, CIS-Lunar Space, the Moon or other planetary bodies, all as previously described. Space platform 400 may include a space station, such as the International Space Station, and preferably space platform 400 is a satellite bus, or spacecraft bus, 401.

Depositor 110 may be any device or equipment that can deposit a material upon a substrate by a vacuum vapor deposition process or any other deposition process herein described. The use of the term "elongate member" is meant to include and describe any structural component, such as the single arm 200 of FIG. 1, which generally is longer than its width, as well as any other structural component, or combination of structural components, which have the requisite characteristics to be used in the manner disclosed herein in connection with a substrate 250 and a depositor 110, such as a jointed arm 200 as shown and described herein, or a rigid arm, or a plurality of jointed and/or rigid arms.

The depositor, 110 of system 100 has a power source 111, feeding energy to the depositor 110 through the elongate member 200, or robotic arm 204, and as will hereinafter be described in connection with FIGS. 2-4, the power source 111 is associated with the depositor 110 to provide energy to the depositor 110 to excite the deposition material disposed within the depositor 110 to form a vapor of the deposition material. Substrate 250 may be any surface upon which a coating, a thin film or a thick film may be deposited by vacuum vapor deposition, as are known in the art, including those substrates previously described. The substrate 250 may be formed of any material as previously described, and may have any shape including, but not limited to, a square configuration, rectangular configuration, circular configuration, or any other desired configuration. Substrate 250 could be a flat planar surface, or, if desired a curved surface, such as a convex or concave surface.

Still with reference to FIG. 1, substrate 250 is associated with the satellite 400, by use of any suitable substrate support structure 260, whereby the substrate 250 may be associated with, or attached to, the space platform 400. The moveable elongate member or arm 200 has first and second ends 201, 202, and the first end 201 of the member 200 is attached to the depositor 110 in any suitable manner, such as by welding, a threaded connection, an adjustable ball joint, or a ball and socket. The second end 202 of the member 200 is associated with the space platform 400, or may be associated with a satellite, space vehicle, or space station (not shown) if desired. Preferably, member 200 is a robotic arm system 204, and the operation and movement of the robotic arm, or member, system 204 may be remotely controlled to move in an appropriate manner, as will be hereinafter described. Member 200, or robotic arm system 204, preferably includes a plurality of pivotable, hinged, and/or rotatable connectors or joints 203, whereby member 200, or robotic arm system 204, may be articulated into any desired configuration to dispose the depositor 110 in any desired location with respect to the substrate 250.

Figure 6:
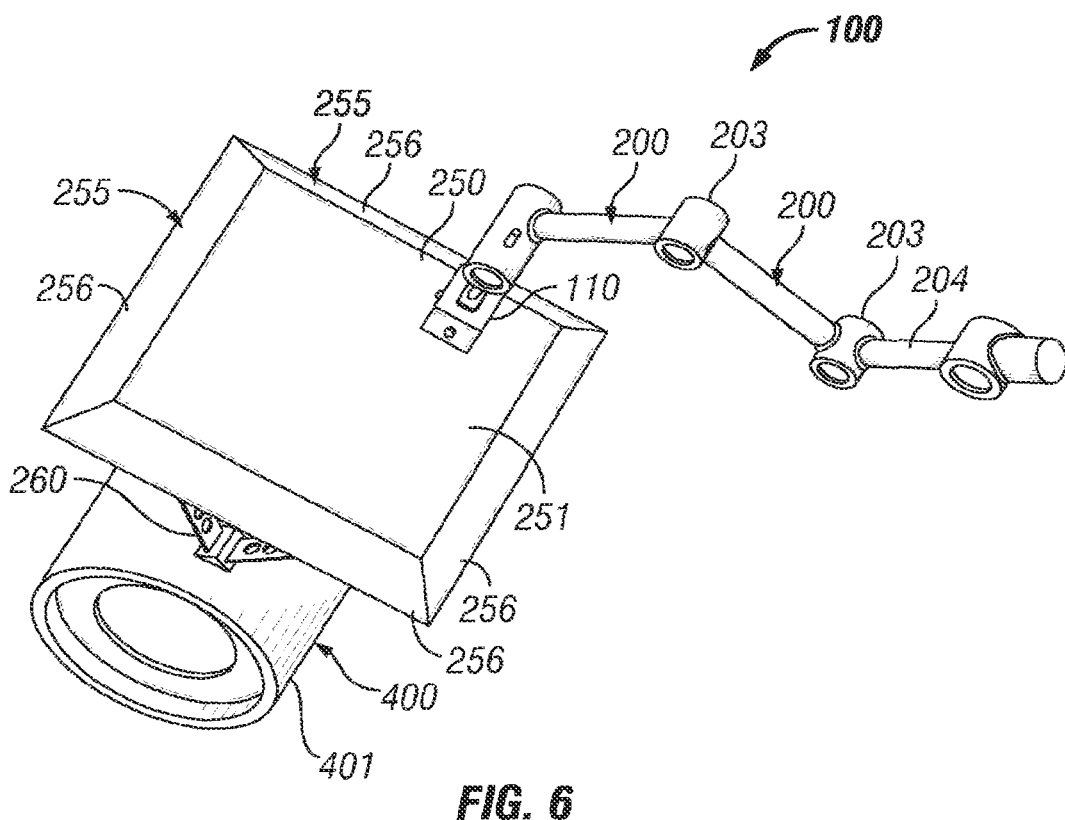
FIG. 6 is a perspective view of the system of FIG. 1, which includes overspray shields associated with a substrate.

While maintaining the substrate 250 in a stationary position with respect to the space platform 400, the member 200, or robotic arm 204 is controlled to move the depositor, 110 over the outer surface 251 of the substrate 250 at an appropriate distance, in order to have the depositor 110 pass over the substrate 250 and for the vapor of deposition material from depositor 110 to flow or stream to the substrate 250 to coat the outer surface 251 of the substrate with the deposition material. The depositor 110 is moved in a manner to cover all areas of the outer surface 251 of the substrate 250 with the deposition material to provide a uniform or non-uniform coating, thin film or thick film material on the substrate 250. The member 200 and depositor 110 may pass over substrate 250 in the direction illustrated by arrows 270 in FIG. 1, as well as in the direction of arrows 275, whereby the depositor 110 passes over substrate 250 in a raster pattern, or a movement from side to side and from top to bottom of substrate 250. The member 200 can also move the depositor 110 over any path over the substrate 250, so as to coat the substrate 250 with a film or coating of a desired thickness and uniformity. If desired, the substrate 250 may have overspray shields 255 (FIG. 6) attached to, or fitted around, substrate 250 to eliminate or minimize coating exterior surfaces of space platform 400. The shields 255 may be positioned in any orientation to best prevent overspray from alighting on exterior surfaces of space platform 400. As shown in FIG. 6, the shields 255 are panels 256 attached to the periphery of substrate 250, and the panels may slant inwardly toward the center of substrate 250.

Figure 5:
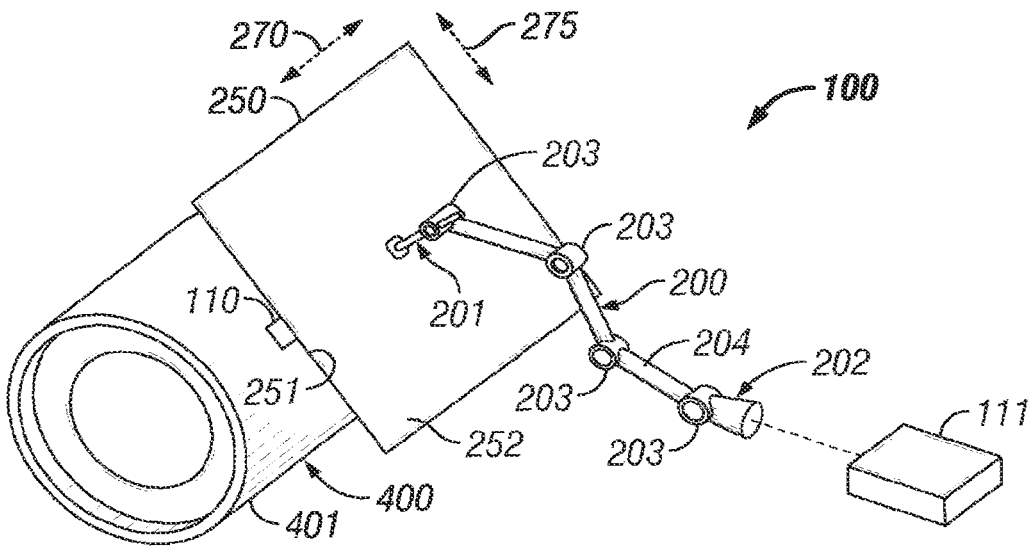
FIG. 5 is a perspective view of a system for vacuum vapor deposition in accordance with another illustrative embodiment of the invention.

Whereas in FIG. 1, the substrate 250 is maintained stationary with respect to the space platform 400, and the depositor 110 and member 200 are moved with respect to the substrate 250, if desired, an alternative embodiment as shown in FIG. 5 is to dispose, or mount, the depositor 110 in a stationary location associated with the space platform 400, and the member 200 would be associated with the substrate 250, preferably as by attaching the first end 201 of member 200 to the back surface 252 of the substrate 250. In this embodiment, the substrate 250 would be moved by the member 200, or robotic arm 204, in any desired or specified pattern, such as a raster pattern, with respect to the fixed, or stationary, depositor 110 associated with space platform 400, so as to coat the outer surface 251 of substrate 250 with a coating or film of a desired thickness and uniformity.

The system 100 of FIGS. 1 and 5 for vacuum vapor deposition of a deposition material upon substrate 250 may utilize different vacuum vapor deposition processes as are known in the art. The vapor of the deposition material may be formed by such deposition processes as thermal evapo- ration, ion-beam evaporation, electron beam evaporation, laser deposition, or other physical vacuum vapor deposition processes. The deposition may also be encompassed by chemical deposition, including chemical vapor deposition, metal organic chemical vapor deposition, metal organic deposition, or other chemical vapor deposition processes.

Figure 2:
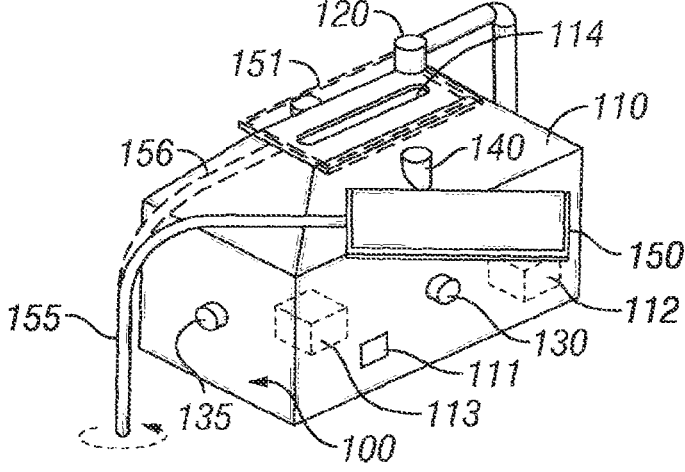
FIG. 2 is a perspective view of a portion of the system for vacuum vapor deposition of FIG. 1.

With reference to FIG. 2, the systems 100 of FIGS. 1 and 5 for vacuum vapor deposition of the deposition material may utilize a thermal evaporation process. In FIG. 2, the depositor 110, includes a boat, or container, disposed within the depositor, as shown schematically at 112, which is nominally inert to the coating or deposition material and holds the deposition material. The depositor 110 includes an energy source disposed within the depositor, as shown schematically at 113 in FIG. 2, to heat the container 112 to cause a vapor of the deposition material to be formed. The energy source 113 may be a resistive heat source which provides Joule heating or resistive heating, to the housing, or boat, 112. Energy source 113 could also be a laser or microwave heat source, or any other heating technique that can heat the boat, or container, 112 to evaporate, or vaporize, the deposition material to provide the desired vapor of deposition material to be applied to the substrate 250. As to the system 100 of FIGS. 1 and 2, energy source 113 may receive its necessary power requirements from the power source 111. As to the system 100 of FIG. 5, the energy source for the depositor 110 mounted to the space platform 400 may receive its necessary power directly from space platform 400, or from the power source 111 associated with member 200, or robotic arm 204.

The depositor 110 may be provided with a device 120 to measure the flow, or flux, of the vapor of deposition material from the container, or boat, 112 inside depositor 110. A camera 140 may be associated with the depositor 110 to monitor the flow of the vapor of deposition material to the substrate 250 and to monitor the movement of the depositor 110 and member 200, or robotic arm 204 with respect to the substrate 250. A vacuum environment measurement gauge 130 may also be associated with the depositor 110 to measure the vacuum of the space environment proximate the system 100. System 100 may also include a coating, or material, performance characteristic measurement device

135, associated with the depositor 110. For example, device 135 may be reflectometer to measure the reflection charac- teristics when a reflective coating is being formed.

Still with reference to FIG. 2, the vapor of the deposition material formed by the heating of the boat, or container, 112 inside depositor 110, exits the depositor 110 via an opening, or slot, 114, formed in the upper end of the depositor 110. Depositor 110 may have a shutter or plate member 150, and the shutter 150 is moveable from a first open position, wherein the vapor of the deposition material may flow from the container or boat 112 inside the depositor 110 to the substrate 250, to a second closed position, wherein the shutter 150 blocks the flow of the vapor from the depositor 110 to the substrate 250. The shutter 150 may be associated with, or attached to, a shutter control arm, or control system, 155, and the rotation of the shutter control arm, or control system, 155 moves the shutter 150 to and from the first and second positions. In FIG. 2, the shutter 150 is in the closed second position as noted by reference numeral 151, wherein the shutter 150 blocks the flow of the vapor of the deposition material from the depositor 110. The first open position of the shutter is also shown in FIG. 2, wherein the shutter 150 is denoted with reference numeral 152. System 100, may also include appropriate electronic equipment to control and provide the energy for the energy source 113 and for the control of camera 140, shutter 150, and vacuum environ- ment measurement gauge 130.

Figure 3:
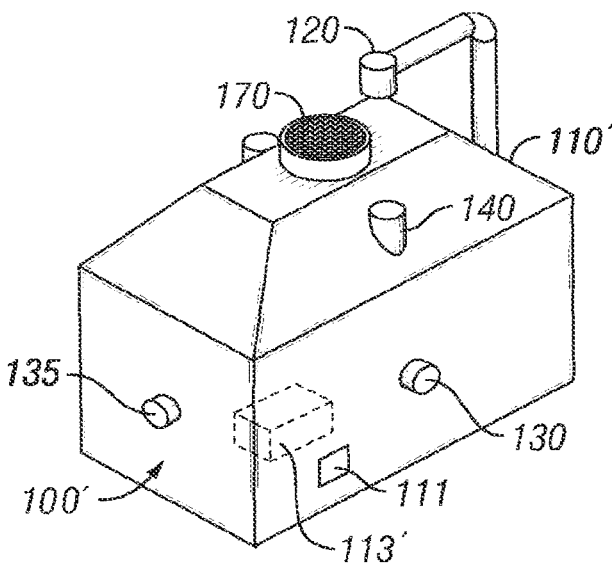
FIG. 3 is a perspective view of a portion of another embodiment of the system for vacuum vapor deposition of FIG. 1.

With reference to FIG. 3, the depositor 110' of a system 100 utilizes an ion-beam evaporation process to form the vapor of the deposition material. This ion-beam or sputter deposition process utilizes a sputter source 170, associated with the depositor 110' which provides the vapor of the deposition material to be applied to the substrate 250. Depositor 110' may include the vacuum gauge 120, camera 140, vacuum environment measurement gauge 130 and performance characteristic measurement device 135, as pre- viously described in connection with the depositor 110 of FIG. 2. If desired, a shutter 150 (FIG. 2), may also be utilized with depositor 110' of FIG. 3. An energy source shown schematically at 113' disposed within depositor 110' may receive its necessary power in the same manner as described in connection with energy source 113 of FIG. 2.

Figure 4:
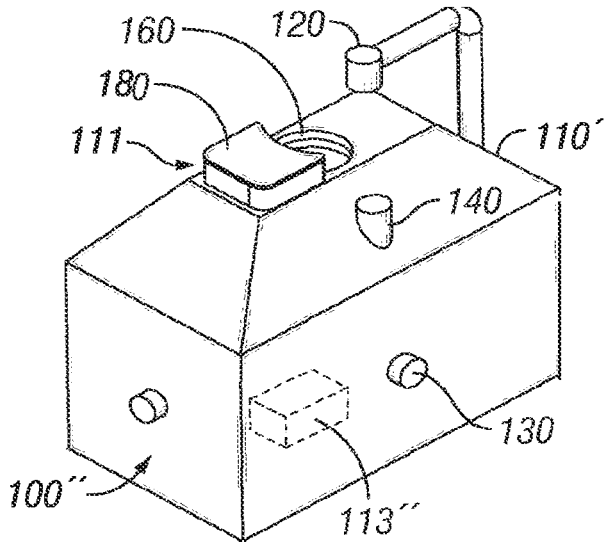
FIG. 4 is a perspective view of another embodiment of a portion of the system for vacuum vapor deposition of FIG. 1.

With reference to FIG. 4, an electron beam evaporation process may be used with depositor 110" of system 100 to form the vapor of the deposition material to be applied to substrate 250. Depositor 110" is provided with an electron gun housing 180 for the electron gun that forms the electron beam which evaporates the deposition material. The electron beam is directed to a crucible shown schematically at 160, in the depositor 110". The depositor 110" of FIG. 4 may also include the other previously described components, vacuum gauge 120, camera 140, vacuum environment measurement gauge 130, and coating performance characteristic measure- ment device 135. Similarly, depositor 110" may include the shutter 150 of the depositor 110 of FIG. 2. An energy source shown schematically at 113" in depositor 110" may receive its necessary power in the same manner as described in connection with energy source 113 of FIG. 2.

Figures 7, 8, 9:
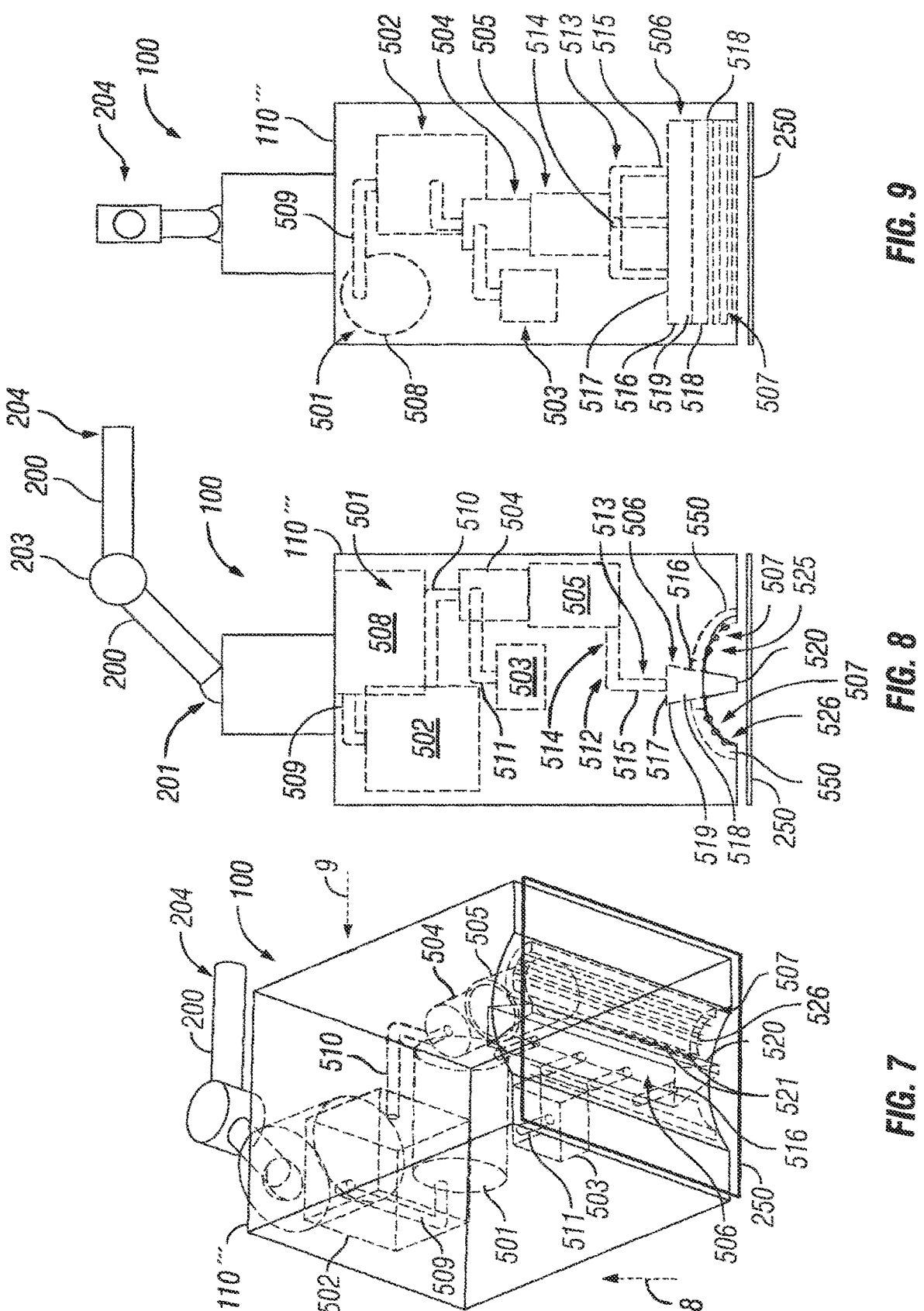
FIG. 7 is a perspective view of a portion of another embodiment of the system for vacuum vapor deposition of FIG. 1.
FIG. 8 is a front view of the system of FIG. 7, when viewed in the direction of arrow 8 in FIG. 7.
FIG. 9 is a side view of the system of FIG. 7, when viewed in the direction of arrow 9 in FIG. 7.

With reference to FIGS. 7-9, a chemical vapor deposition process may be used with depositor 110''' to form the vapor of the deposition material to be applied to substrate 250. In general, depositor 110''' vaporizes a mixture of a precursor, a gas, typically oxygen, and a carrier gas, and the resulting vapor is distributed over a heated substrate to form the desired coating, thin film, or thick film upon the substrate, The depositor 110''' may include: a gas storage system 501; a gas flow delivery module 502; a precursor storage system 503; a precursor feed system 504; an evaporator 505; a vapor distributor, or distribution, system 506; and a heating system 507; all as will be hereinafter described.

The gas storage system 501 stores the gas, typically oxygen, and the carrier gas, for example nitrogen, which is subsequently vaporized with the precursor. Gas storage system 501 may preferably be a gas storage tank 508, a cylindrical shaped tank being shown, but any shape of tank could be used that fits within depositor 110'''. Gas flow delivery module 502 is in fluid communication with tank 508 via suitable piping 509, and module 502 controls the flow of the gases to the precursor feed system 504 via suitable piping 510. Other carrier gases could be utilized dependent upon the desired coating, thin film, or thick film to be formed on substrate 250. For example, use of nitrous oxide as a carrier gas, when used with a suitable organo-metallic precursor, can form on oxide layer, or dielectric layer, upon substrate 250. Examples of other carrier, gases, include, but are not limited to, argon, nitrogen, helium, and other gases known to those working in the field of chemical vapor deposition processes.

Still with reference to FIGS. 7-9, precursor storage system 503 for the desired precursor is also in fluid communication with precursor feed system 504, as by suitable piping 511. Feed system 504 preferably includes a liquid injector, or injector nozzle, which injects precise amounts of the precursor and gases into evaporator 505. Alternatively if desired, precursor storage system 503 could be disposed in fluid communication with gas flow delivery module 502, which module 502 can control the flow of precursor and the gases to the precursor feed system 504. The precursor which flows into the precursor feed system 504 is a liquid precursor, which originally is in a liquid form, or may be initially provided in a power or solid form, which is combined with a suitable solvent that dissolves the powder or solid into a liquid as is known in the art.

Still with reference to FIGS. 7-9, the precursor and gases mixture is vaporized in a conventional manner within evaporator 505, as is known in the art. The evaporator 505 is in fluid communication with the vapor distributor system 506 via suitable piping 512, which preferably is a manifold 513 which may include a plurality of pipes, or fluid conduits, 514, 515. The vapor of the vaporized precursor and gases may flow from evaporator 505 through manifold 513 into the vapor distribution system 506. The vapor distribution system 506 includes a plurality of outlets, nozzles, or ports, which may function in a manner similar to those of a showerhead, through which the deposition material, or precursor and gases vapor, may pass and be directed toward substrate 250. Vapor distributor system 506 may be an elongate housing 516 formed by a top panel, or wall, 517, end panels, or walls, 518, side walls, or panels, 519, and a bottom panel, or wall, 520, in which the plurality of outlets, nozzles, or ports 521 (FIG. 7) are formed.

Still with reference to FIGS. 7-9, heating system 507 is disposed in depositor 110''' at a location whereby heat, or irradiation, may be directed toward the substrate 250, to heat substrate 250. Preferably, heating system 507 may include an energy source 525, such as a plurality of quartz halogen lamps, infra-red lamps, or high power laser diodes 526 which may be disposed in a spaced relationship from the substrate 250 and the housing 516 of vapor distribution system 506. The diodes or lamps 526 may be disposed substantially parallel to the side walls 519 of housing 516. Cooled reflector shrouds, or shields, 550 may be provided to reflect energy, or heat, from the diodes or lamps 526 back toward the substrate 250. The vapor distribution system 506 uniformly distributes the precursor and gases vapors to flow across a portion of substrate 250. The precursor and gases vapors exiting the nozzles 521 of housing 516 are reacted under the influence of the energy source 525 which has heated the substrate, and the desired coating, thin film, or thick film, such as an oxide, or dielectric, layer is formed upon substrate 250.

Depositor 110''' preferably includes an arm, or elongate member, 200 or robotic arm 204 as previously described in connection with FIGS. 1 and 5, which robotic arm system 204 can supply power to, and communication with, depositor 110'''. The robotic arm 204 can move depositor 110''' across and over substrate 250 to cover the substrate 250 and to provide a film or coating upon substrate 250 of a desired thickness and uniformity, as previously described in connection with FIG. 1.

Figure 10:
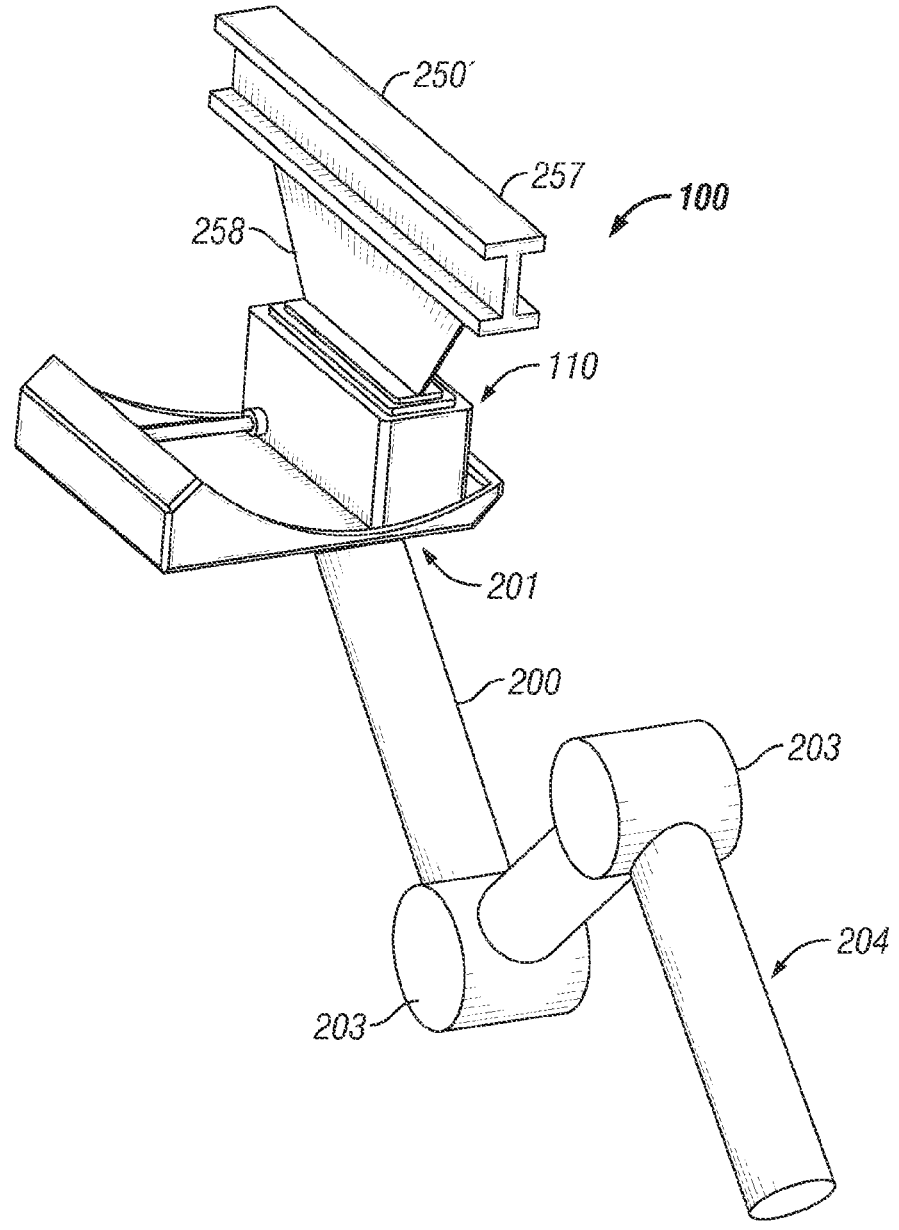
FIG. 10 is a perspective view of another embodiment of the system for vacuum deposition of FIG. 1, wherein the substrate is a linear element.

With reference to FIG. 10, a deposition system 100 is shown coating a substrate 250', which is a linear element, such as a truss or I-beam structural element 257, with a coating of a vapor, or flux, 258 of a deposition material by a depositor 110, as previously described. Depositor 110 may be any of the depositors, 110, 110', 110'', 110''', described herein. A substrate support structure (not shown) associated with a space platform 400 (FIG. 1) supports the substrate 250' with respect to the space platform 400. A moveable elongate arm or member 200, as previously described has its first end 201 associated with the depositor 100, which arm 200 moves the depositor 100 with respect to the substrate 250' to coat whatever portion of the substrate is desired to be coated. The arm 200 may be a robotic arm system 204, as previously described. The depositor 110 may be moved by the arm 200, or robotic arm system 204 around the substrate 250', as well as along the longitudinal axis of the linear element 257, to completely coat the linear element 257, or to coat desired portions of the linear element. If desired a plurality of depositors 110 could be associated with the arm system 204.

Figure 11:
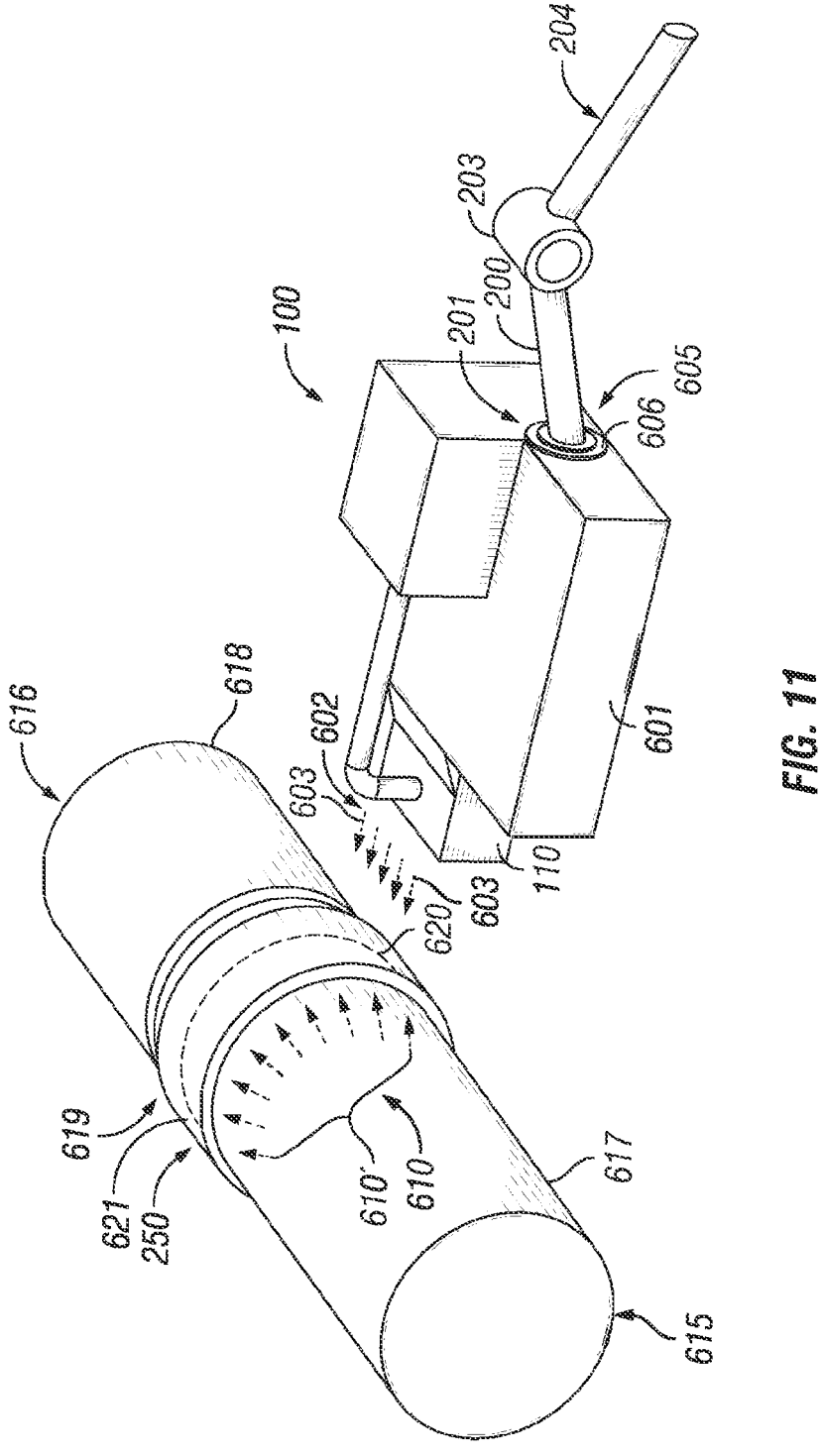
FIG. 11 is a perspective view of another embodiment of the system for vacuum deposition of FIG. 1, wherein the substrate is a joint between two structural elements.

With reference to FIG. 11, another system 100 for vacuum vapor deposition of a coating, thin film, or thick film upon a substrate 250 in a space environment in accordance with an illustrative embodiment is shown. The deposition system 100 generally includes: a depositor 110 for the deposition material; a power and deposition materials management module 601; an arm, or elongate member, 200, or robotic arm, or robotic arm system, 204, as previously described; and a power or energy source 111 (FIG. 1) associated with robotic arm 204 as previously described. The depositor 110 may be any of the depositors 110, 110', 110'', 110''' previously described herein. The power and depositor materials management module 601: supports depositor 110; contains the deposition material to be vacuum vaporized into a flux, or vapor, 602 of the deposition material, as indicated by arrows 603; controls the power being supplied to depositor 110 from energy source 111 (FIG. 1) via the robotic arm 204; and manages and controls the operation of depositor 110 from the electronic data communications received via robotic arm system 204. One end 201 of the robotic arm system 204 is associated with the module 601 by any suitable connector 605, such as a ball and socket connector, or joint, 606, and the robotic arm system 204 at its other end is associated with a space platform 400, as previously described.

Still with reference to FIG. 11, the substrate 250 is a joint, or joint area around the joint, 610 as indicated by arrows 610' between two structure elements 615, 616. A substrate supports structure (not shown) associated with a space platform 400 (FIG. 1) supports substrate 250 and structure elements 615, 616 with respect to the space platform 400. Element 615 could be a piece, or length, of a solid rod member 617 as shown in FIG. 11, or a piece, or length, of a pipe member. Structure member 616 could be a piece of a pipe member 618 with its end 619 swaged to provide an enlarged diameter, or female end, 621 to receive the end 620 of structure element 615. Alternatively, element 616 could be solid rod member with a swaged connector at end 619. Structure elements 615, 616 could have other shapes and cross-sectional configurations if desired.

After structural elements 615, 616 have been connected together as shown in FIG. 11, depositor 110 may be operated, or energized, to form a vapor, or flux 602, 603 of the deposition material; and depositor 110 is moved by robotic arm system 204 under and around the joint area 610, 610' to deposit a coating, thin film or thick film of the deposition material over the joint area 610, 610'. Preferably, a thick film of the deposition material is formed and deposited over joint are 610, 610'. The deposited thick film can join, or bond, the two structural elements 615, 616 together, or rigidize the joint 610, 610'. If desired system 100 and depositor 110 of FIG. 11, may also be used to repair structures in space or to replace a variety of materials used in space. The depositor 110 may utilize any number of deposition, or joining, materials, including but not limited to indium, cadmium, zinc, barium strontium lead, magnesium, titanium, including alloys of multiple materials.

Figure 12:
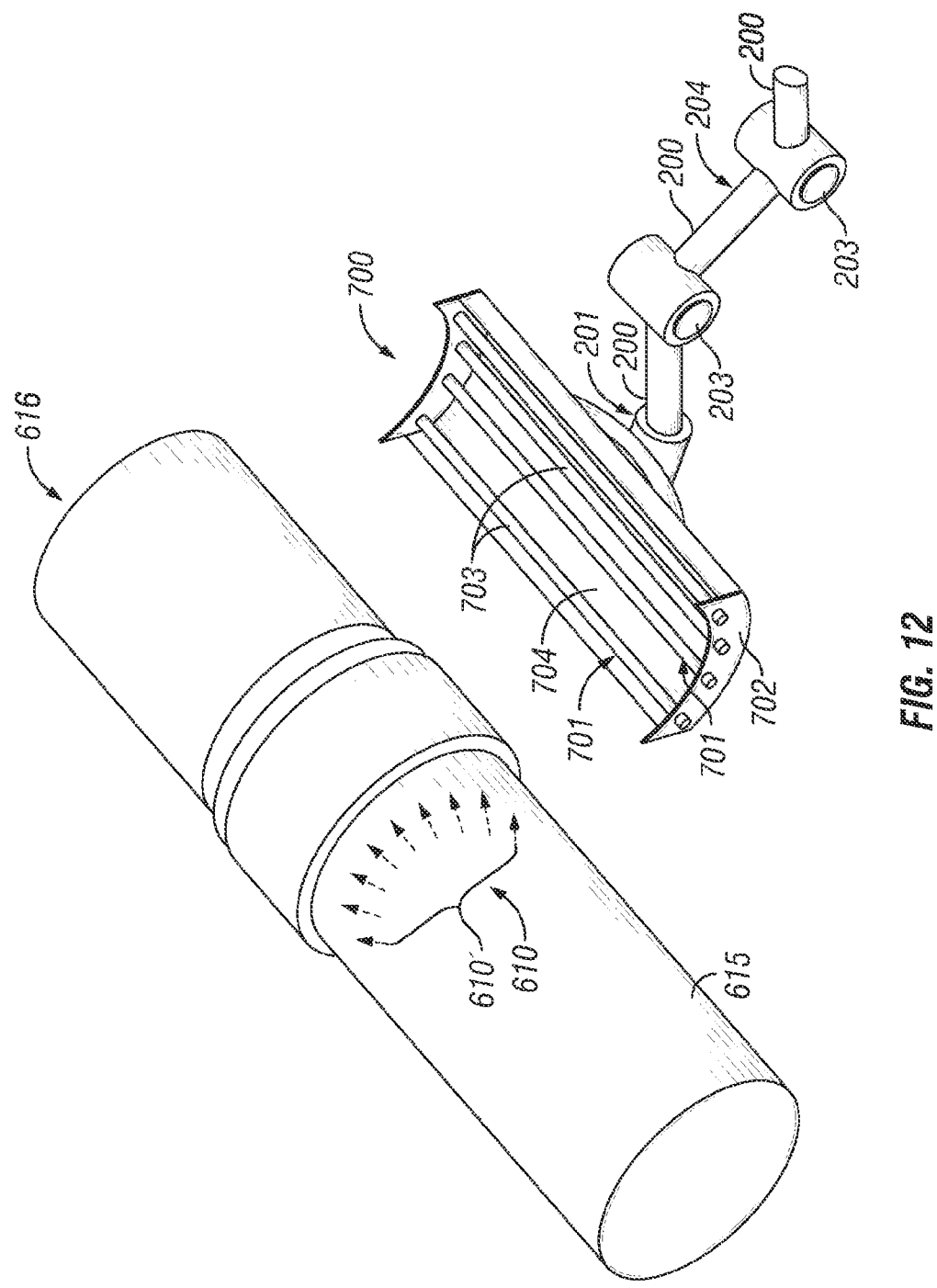
FIG. 12 is a perspective view of an additional component for use with the system of FIG. 11.

After the two structural elements are joined, or rigidized, as previously described, if desired the joint 610 may be taken apart, or disassembled by heating the joint area 610, 610' to remove, or dissolve, the thick film from the joint area 610, 610' to permit the joined structural elements 615, 616 to be taken apart or separated from each other. With reference to FIG. 12, a heating system 700 is associated with a robotic arm system 204 as previously described. Heating system 700 may be moved into close proximity to the joint area 610 between the structural elements 615, 616 by the robotic arm 204, and upon the heating system 700 being activated and operated, the joint 610 may be heated and dissolved and/or removed. Heating system 700 may include at least one, and preferably a plurality of, energy sources 701 that can generate and focus heat onto the joint area 610. Energy sources 701 are disposed within a heating system housing, or shroud, 702 and housing 702 is associated with the first end 201 of a robotic arm 204 as previously described herein by any suitable connector. The energy sources may preferably be a plurality of halogen, quartz halogen lamps, infra-red lamps, an electron beam, or any other suitable heat source 703 disposed within housing 702. The robotic arm system 204 is associated with a power, or energy, source 111 (FIG. 1) as previously described which provides the necessary energy to operate the lamps 703. The other end of robotic arm system 204 is associated with a space platform 400 (FIG. 1) as previously described.

Figure 13:
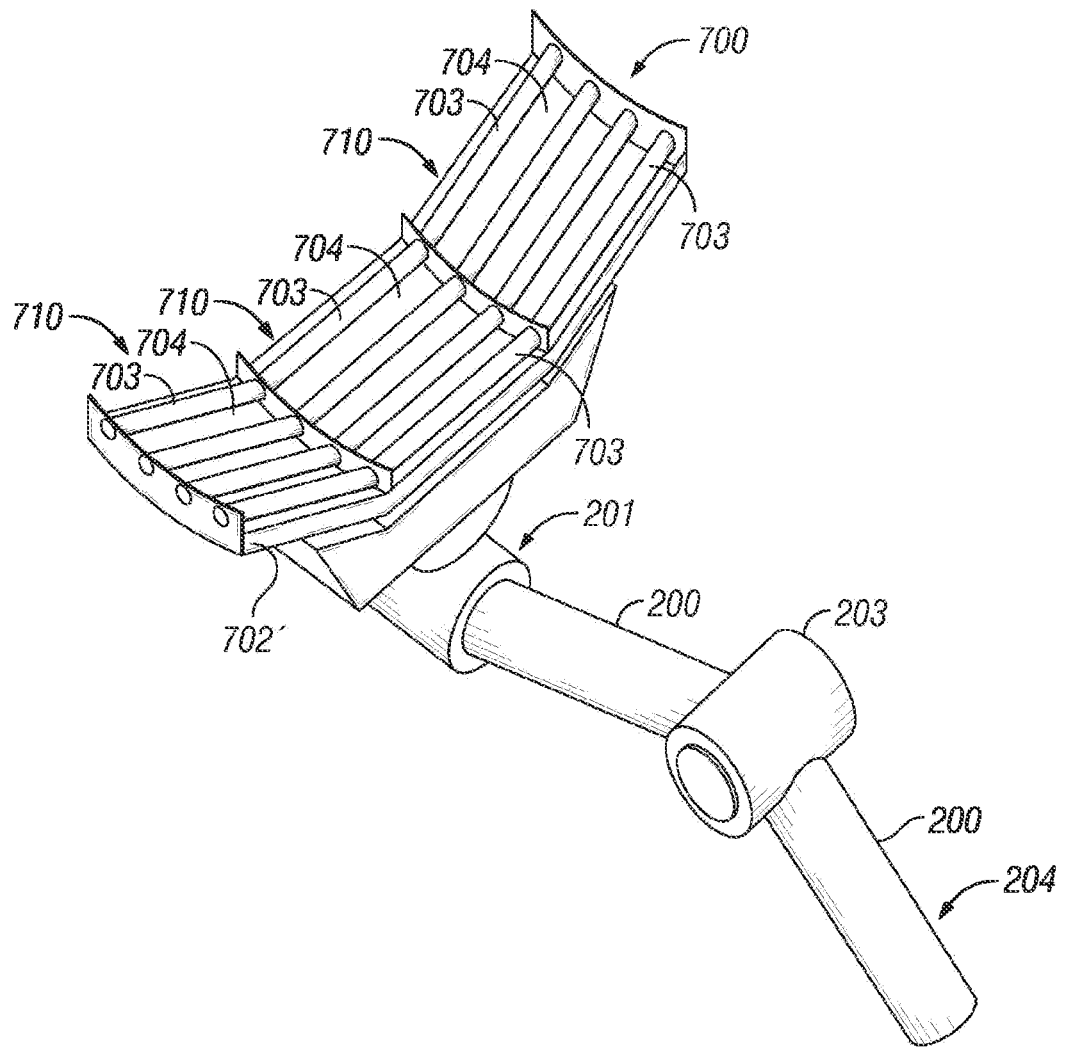
FIG. 13 is a perspective view of another embodiment of the component of FIG. 12.

If desired the interior wall surface 704 of housing 702 may be provided, or coated, with a highly reflective and/or protective material such as silver, gold, aluminum or other materials, to maximize the reflectance of the interior wall surface 704 of housing 702 to help focus the heat energy from lamps 703 onto the joint are 610. If desired housing 702 may be cooled by supplying a cooling fluid or gas medium to the housing 702 via robotic arm system 204. If desired, the heating system 700 of FIG. 12, may be made of a plurality of segments as shown in FIG. 13, wherein heating system 700' is formed of a plurality of heating segments 710 disposed within a modified housing 702' whereby a larger portion of joint 610, 610' may be irradiated, or heated, by heating system 700'. Each heating segment 710 includes a plurality of lamps and/or other heat sources 703, and each heating segment 710 is angularly disposed from its adjacent segment 710. Preferably, housing 702' angularly conforms to the disposition of heating segments 710.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. When numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). The use of the term "about" means ±10% of the subsequent number, unless otherwise stated.

Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above, but is defined by the claims that follow, that scope including all equivalents of the subject matter of the claims. Each and every claim is incorporated as further disclosure into the specification and the claims are embodiment(s) of the present disclosure.

While several exemplary embodiments have been provided in the present disclosure, it may be understood that the disclosed embodiments might be embodied in many other specific forms without departing from the spirit or scope of the present disclosure and the appended claims. The present examples are to be considered as illustrative and not restrictive, and the intention is not to be limited to the details given herein. For example, the various elements or components may be combined or integrated in another system or certain features may be omitted, or not implemented.

In addition, the various exemplary embodiments described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A system for vacuum vapor deposition of a deposition material upon a substrate in a space environment, comprising:

a substrate support structure associated with a space platform on a surface of a planetary body outside of any chamber in the space environment;

a depositor for the deposition material;

an energy source associated with the depositor to excite the deposition material to form a vapor of the deposition material; and a moveable elongate member associated with the depositor, to move the depositor over the substrate, wherein the moveable elongated member is configured to support flow of at least electrical power for antennas, radars, reflectors, and photovoltaic power systems, electron guns for forming an electron beams, and support of fluid transfer for cooling, for reagents and other fluids, and for gases for propulsion, for transfer, and for a precursor gas feed system, wherein the elongate member is a robotic arm, whereby the vapor of deposition material from the depositor may pass over the substrate and flow to the substrate to coat the substrate with the deposition material.

2. The system of claim 1, wherein the elongate member has first and second ends, the first end being attached to the depositor.

3. The system of claim 1, wherein a shutter is associated with the depositor and is moveable from a first position with respect to the depositor, wherein the vapor of the deposition material may flow from the depositor to the substrate, to a second position, wherein the shutter blocks the flow of the vapor from the depositor to the substrate.

4. The system of claim 1, wherein a precursor storage system and a heating system are operably coupled to the depositor, the heating system configured to heat the substrate.

5. The system of claim 1, wherein the energy source comprises an electron beam.

6. The system of claim 1, wherein the energy source comprises a resistive heat source.

7. The system of claim 1, wherein the energy source comprises a laser.

8. The system of claim 1, wherein the planetary body is a Moon or Mars.

9. A method for vacuum vapor deposition of a deposition material upon a substrate in a space environment to form a functional material on the substrate comprising:

disposing a substrate on a substrate support structure on a surface of a planetary body outside of any chamber in the space environment;

providing a depositor for the deposition material;

providing an energy source associated with the depositor and exciting the deposition material to form a vapor of the deposition material;

providing a moveable elongate member, wherein the moveable elongated member is configured to support flow of at least electrical power for antennas, radars, reflectors, and photovoltaic power systems, electron guns for forming an electron beams, and support of fluid transfer for cooling, for reagents and other fluids, and for gases for propulsion, for transfer, and for a precursor gas feed system, and wherein the elongate member is a robotic arm system, associated with the depositor; and moving the depositor and the elongate member to pass over the substrate to direct the vapor of the deposition material to flow to the substrate to form a functional material on the substrate.

10. The method of claim 9, wherein the elongate member has first and second ends, and wherein the method further includes attaching the first end to the depositor.

11. The method of claim 9, including associating a shutter with the depositor which is moveable from a first position with respect to the depositor, which first position permits the vapor of the deposition material to flow from the depositor to the substrate, to a second position, which second position blocks the flow of the vapor from the depositor to the substrate.

12. The method of claim 9, wherein a precursor storage system and a heating system are operably coupled to the depositor, the heating system configured to heat the substrate.

13. The method of claim 9, including utilizing an electron beam as the energy source.

14. The method of claim 9, including utilizing a resistive heat source as the energy source.

15. The method of claim 9, including utilizing a laser as the energy source.

16. The method of claim 9, wherein the functional material comprises a solar cell.

17. The method of claim 9, wherein the functional material comprises a thin film material.

18. The method of claim 9, wherein the planetary body is a Moon or Mars.

19. A system for vacuum vapor deposition of a deposition material upon a substrate in a space environment, comprising:

a substrate support structure on a surface of a planetary body outside of any chamber in the space environment;

a depositor for the deposition material;

an energy source associated with the depositor to excite the deposition material to form a vapor of the deposition material; and the substrate support structure includes a moveable elongate member associated with the substrate, wherein the moveable elongated member is configured to support flow of at least electrical power for antennas, radars, reflectors, and photovoltaic power systems, electron guns for forming an electron beams, and support of fluid transfer for cooling, for reagents and other fluids, and for gases for propulsion, for transfer, and for a precursor gas feed system, and wherein the elongate member is a robotic arm system, to move the substrate over the depositor, whereby the vapor of deposition material from the depositor may flow from the depositor to the substrate to coat the substrate with the deposition material.

20. The system of claim 19, wherein the elongate member has first and second ends, the first end being attached to the substrate.

21. The system of claim 19, wherein a shutter is associated with the depositor and is moveable from a first position with respect to the depositor, wherein the vapor of the deposition material may flow from the depositor to the substrate, to a second position, wherein the shutter blocks the flow of the vapor from the depositor to the substrate.

22. The system of claim 19, wherein a precursor storage system, and a heating system are operably coupled to the depositor, the heat system configured to heat the substrate.

23. The system of claim 19, wherein the energy source comprises an electron beam.

24. The system of claim 19, including utilizing a laser as the energy source.

25. The system of claim 19, including utilizing a resistive heat source as the energy source.

26. The system of claim 19, wherein the substrate movement over the depositor is rotational.

27. The system of claim 19, wherein the planetary body is a Moon or Mars.

28. A method for vacuum vapor deposition of a deposition material upon a substrate in a space environment to form a functional material on the substrate comprising:

providing a substrate on a surface of a planetary body outside of any chamber in the space environment;

providing a depositor for the deposition material;

providing an energy source associated with the depositor and exciting the deposition material to form a vapor of the deposition material;

providing a moveable elongate member, associated with the substrate, wherein the moveable elongated member is configured to support flow of at least electrical power for antennas, radars, reflectors, and photovoltaic power systems, electron guns for forming an electron beams, and support of fluid transfer for cooling, for reagents and other fluids, and for gases for propulsion, for transfer, and for a precursor gas feed system, and wherein the elongate member is a robotic arm system; and moving the substrate and the elongate member to pass over the depositor to direct the vapor of the deposition material to flow to the substrate to form a functional material on the substrate.

29. The method of claim 28, wherein the elongate member has first and second ends, and wherein the method includes attaching the first end to the substrate.

30. The method of claim 28, including associating a shutter with the depositor which is moveable from a first position with respect to the depositor, which first position permits the vapor of the deposition material to flow from the depositor to the substrate, to a second position, which second position blocks the flow of the vapor from the depositor to the substrate.

31. The method of claim 28, wherein a precursor storage system and a heating system are operably coupled to the depositor, the heating system configured to heat the substrate.

32. The method of claim 28, including utilizing an electron beam as the energy source.

33. The method of claim 28, including utilizing a resistive heat source as the energy source.

34. The method of claim 28, including utilizing a laser as the energy source.

35. The method of claim 28 wherein the substrate movement over the depositor is rotational.

36. The method of claim 28 wherein the functional material comprises a solar cell.

37. The method of claim 28, wherein the functional material comprises a thin film material.

38. The method of claim 28, wherein the planetary body comprises a Moon or Mars.

39. A method for vacuum vapor deposition of a deposition material upon a substrate in a space environment to join a first structural element to a second structural element comprising:

disposing a substrate in a substrate support structure on a surface of a planetary body outside of any chamber in the space environment, wherein the substrate is a joint between the first and second structural members;

providing a depositor for the deposition material;

providing an energy source associated with the depositor and exciting the deposition material to form a vapor of the deposition material;

providing a moveable elongate member, associated with the depositor, wherein the moveable elongated member is configured to support flow of at least electrical power for antennas, radars, reflectors, and photovoltaic power systems, electron guns for forming an electron beams, and support of fluid transfer for cooling, for reagents and other fluids, and for gases for propulsion, for transfer, and for a precursor gas feed system, and wherein the moveable elongate member is a robotic arm; and moving the depositor and the elongate member to pass over the substrate to direct the vapor of the deposition material to flow to the substrate to join the first and second structural elements to each other.

40. The method of claim 39, wherein the elongate member has first and second ends, and attaching the first end to the depositor.

41. The method of claim 39, wherein the elongate member is a robotic arm system.

42. The method of claim 39, including providing a heating system to heat the substrate to remove the deposition material to unjoin the first and second structural elements.

43. The method of claim 39, wherein the planetary body is a Moon or Mars.

* * * * *